US011107893B2

(12) United States Patent
Schulze et al.

(10) Patent No.: US 11,107,893 B2
(45) Date of Patent: Aug. 31, 2021

(54) METHOD FOR FORMING A SEMICONDUCTOR DEVICE AND A SEMICONDUCTOR DEVICE

(71) Applicant: Infineon Technologies AG, Neubiberg (DE)

(72) Inventors: Hans-Joachim Schulze, Taufkirchen (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/193,085

(22) Filed: Nov. 16, 2018

(65) Prior Publication Data

US 2019/0157395 A1 May 23, 2019

(30) Foreign Application Priority Data

Nov. 17, 2017 (DE) .................. 102017127169.4

(51) Int. Cl.
*H01L 29/165* (2006.01)
*H01L 21/268* (2006.01)
(Continued)

(52) U.S. Cl.
CPC ...... *H01L 29/165* (2013.01); *H01L 21/02378* (2013.01); *H01L 21/02444* (2013.01);
(Continued)

(58) Field of Classification Search
CPC ......... H01L 21/02612; H01L 21/02444; H01L 21/187; H01L 21/02378; H01L 21/268;
(Continued)

(56) References Cited

U.S. PATENT DOCUMENTS

2013/0009171 A1* 1/2013 Harada ............ H01L 21/02002
257/77
2017/0018614 A1 1/2017 Rupp et al.
(Continued)

FOREIGN PATENT DOCUMENTS

WO WO2018123148 A1 * 5/2018 ............ H01L 21/20

OTHER PUBLICATIONS

Machine Translation of Itoh et al. (WO2018/123148 A1) Jul. 5, 2018.*

*Primary Examiner* — Caridad Everhart
(74) *Attorney, Agent, or Firm* — Murphy, Bilak & Homiller, PLLC

(57) ABSTRACT

A method of forming a semiconductor device and a semiconductor device are provided. The method includes forming a graphene layer at a first side of a silicon carbide substrate having at least next to the first side a first defect density of at most $500/cm^2$. An acceptor layer is attached at the graphene layer to form a wafer-stack. The acceptor layer includes silicon carbide having a second defect density higher than first defect density. The wafer-stack is split along a split plane in the silicon carbide substrate to form a device wafer including the graphene layer and a silicon carbide split layer at the graphene layer. An epitaxial silicon carbide layer extending to an upper side of the device wafer is formed on the silicon carbide split layer. The device wafer is further processed at the upper side.

20 Claims, 3 Drawing Sheets

(51) Int. Cl.
*H01L 21/02* (2006.01)
*H01L 21/04* (2006.01)
*H01L 21/18* (2006.01)

(52) U.S. Cl.
CPC .. *H01L 21/02527* (2013.01); *H01L 21/02612* (2013.01); *H01L 21/0455* (2013.01); *H01L 21/187* (2013.01); *H01L 21/268* (2013.01)

(58) Field of Classification Search
CPC . H01L 21/02527; H01L 29/165; H01L 29/65; H01L 29/1606; H01L 21/0455; H01L 29/265; H01L 29/6606; H01L 29/32; H01L 29/1608; H01L 29/8611; H01L 29/1095; H01L 29/0485; H01L 21/02002; H01L 21/6606; H01L 21/32; H01L 21/1608; H01L 21/8611; H01L 21/1095; H01L 21/0485
See application file for complete search history.

(56) References Cited

U.S. PATENT DOCUMENTS

2017/0033011 A1 2/2017 Rupp et al.
2017/0278930 A1 9/2017 Ruhl et al.

* cited by examiner

METHOD FOR FORMING A SEMICONDUCTOR DEVICE AND A SEMICONDUCTOR DEVICE

TECHNICAL FIELD

Embodiments of the present invention relate to a method for forming a semiconductor device, in particular to a method for forming silicon carbide (SiC) semiconductor devices on wafer-level, and a semiconductor device.

BACKGROUND

In particular bipolar SiC power semiconductor devices may be subject to bipolar degradation. This means that the energy released by electron-hole recombination in the SiC semiconductor material during device operation converts the thermodynamically metastable 4H and 6H poly types of SiC into the stable 3C poly type. The resulting crystal defects may form stacking faults, which may propagate through an entire drift zone and can act as a barrier for the current flow. Accordingly, the voltage drop in the forward direction and, thus, the conduction losses may be increased.

Bipolar degradation may affect not only bipolar SiC-based diodes and IGBTs (Insulated Gate Bipolar Transistors), but also unipolar SiC devices such as MOSFETs (Metal Oxide Semiconductor Field Effect Transistors) and JFETs (Junction Field Effect Transistors) with integrated PN free-wheeling diode(s).

The methods used so far for reducing bipolar degradation are very complex and expensive. This particularly applies to reducing formation of crystal defects such as basal plane dislocations (BPDs) during crystal growing used to obtain single SiC crystals. Alternatively or in addition, screening methods may be used to eliminate chips with high defect density, but this leads to a noticeable loss of yield.

For these and other reasons there is a need for the present invention.

SUMMARY

According to an embodiment for a method of forming a semiconductor device, the method includes forming a graphene layer at a first side of a silicon carbide substrate having at least next to the first side a first defect density of at most $500/cm^2$. An acceptor layer is attached at the graphene layer to form a wafer-stack. The acceptor layer is made of silicon carbide having a second defect density which is higher than the first defect density, typically of at least about $1500/cm^2$, or more typically of at least about $3000/cm^2$. The wafer-stack is split along a split plane in the silicon carbide substrate to form a device wafer including the graphene layer and a silicon carbide split layer at the graphene layer. An epitaxial silicon carbide layer extending to an upper side of the device wafer is formed on the silicon carbide split layer, typically after an optional polishing process. The device wafer is further processed at the upper side.

According to an embodiment of a method for forming a semiconductor device, the method includes providing a wafer-stack including a monocrystalline first silicon carbide layer having a first defect density of basal plane dislocations, a second silicon carbide layer having a second defect density of basal plane dislocations which is at least two times, more typically at least three times or even more than ten times or even more than 100 times the first defect density, and an intermediate layer which is not based on silicon carbide, sandwiched between the first silicon carbide layer and the second silicon carbide layer, and includes recombination centers for holes. The wafer-stack is split along a split plane in the silicon carbide layer to form a device wafer including the intermediate layer and a silicon carbide split layer covering the intermediate layer. Silicon carbide is epitaxially deposited to form an epitaxial silicon carbide layer at the silicon carbide split layer. A rectifying junction is formed in and/or at the epitaxial silicon carbide layer.

According to an embodiment of a semiconductor device, the semiconductor device includes a monocrystalline first silicon carbide layer having a first density of basal plane dislocations. A conductive intermediate layer is arranged at the monocrystalline first silicon carbide layer, and includes at least one of graphene, a ternary nitride, and a ternary carbide and/or a carbon layer. A second silicon carbide layer is arranged at the conductive intermediate layer, and includes a second density of basal plane dislocations. The second density of basal plane dislocations is at least two times the first density of basal plane dislocations. A front-side metallization is arranged on the first silicon carbide layer. A back-side metallization is arranged on the second silicon carbide layer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1A:
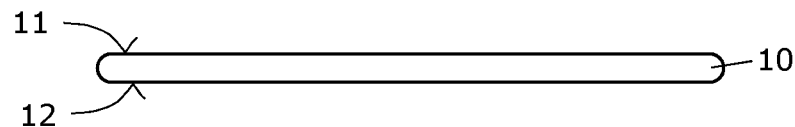
FIGS. 1A to 1E, 2A to 2D, and 3A illustrate method steps of a method for forming a semiconductor device on wafer level in respective vertical cross-sections through wafers and wafer stacks, respectively, according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first side of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, manufacturing SiC-based semiconductor devices on wafer level and the manufactured SiC-based semiconductor devices.

When referring to semiconductor devices, at least two-terminal devices are meant, an example is a diode. Semiconductor devices can also be three-terminal devices such as a field-effect transistors (FETs), insulated gate bipolar transistors (IGBTs), junction field effect transistors (JFETs), and thyristors to name a few. The semiconductor devices can also include more than three terminals.

Wide band-gap semiconductor materials such as SiC or GaN (gallium nitride) have a high breakdown field strength and high critical avalanche field strength, respectively. Accordingly, the doping of semiconductor regions can be chosen higher compared to lower band-gap semiconductor materials which reduces the on-state resistance Ron (also referred to as on-resistance Ron). In the following, embodiments are mainly explained with regard to SiC as wide band-gap semiconductor material.

The SiC-based semiconductor devices to be manufactured may be power semiconductor devices.

The term "power semiconductor device" as used in this specification intends to describe a semiconductor device on a single chip with high voltage and/or high current switching capabilities. In other words, power semiconductor devices are intended for high current, typically in the ampere range. Within this specification the terms "power semiconductor device" and "power semiconductor component" are used synonymously.

The term "field-effect" as used in this specification intends to describe the electric-field mediated formation of a conductive "channel" and/or control of conductivity and/or shape of the channel in a semiconductor region using an insulated gate electrode or a Schottky-gate electrode.

In the context of the present specification, the term "in Ohmic connection" intends to describe that there is an Ohmic current path, e.g. a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical ((intimate physical)) contact and in Ohmic connection. The terms "electrical connection" and "electrically connected" describes an Ohmic connection between two features.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1A to FIG. 3A illustrate processes of a method for forming a semiconductor device on wafer-level.

As illustrated in FIG. 1A, a high quality monocrystalline silicon carbide donor substrate SiC, typically a respective donor wafer 10 may be provided in a first process. The SiC donor wafer 10 may be of the 4H—SiC poly type having a Si-side (e.g. a silicon atom-terminated surface, also known as Si-face) 12 and C-side (e.g. a carbon atom-terminated surface, also known as C-face) 11. Further, the SiC donor wafer 10 may be cut from a SiC ingot.

The SiC donor wafer 10 is typically (substantially) free of stacking faults.

The SiC donor wafer 10 may have, in particular in embodiments without further epitaxial depositing of poly-SiC prior to forming an intermediate layer 30 having recombination centers for holes on the SiC donor wafer 10, at least at and/or close to the Si-side 11 forming a first side of the SiC donor wafer 10, a first defect density of at most $5*10^2/cm^2$, more typically of at most $2.5*10^2/cm^2$, and even more typically of at most $1*10^2/cm^2$. In particular, the SiC donor wafer 10 may have, at least at and/or close to the first side 11, for example throughout the wafer, a first median defect density of basal plane dislocations (BPDs) of at most $5*10^2/cm^2$, more typically of at most $2.5*10^2/cm^2$, and more typically of at most $1*10^2/cm^2$. The (median) defect density of BPDs may be given by the manufacturer of the donor wafer 10. Further, the (median) defect density of BPDs can be detected relatively easily by etching the SiC donor wafer 10 at the first side 11 and optical inspection.

Figure 1B:
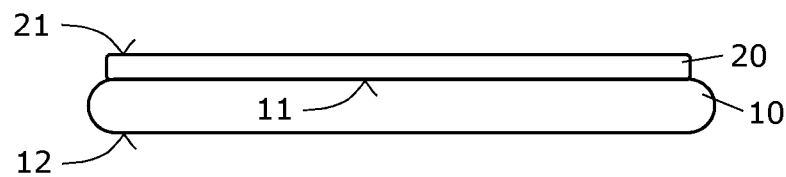

Thereafter, a monocrystalline epitaxial silicon carbide layer 20 may preferably be formed at the first side 11 of the silicon carbide donor wafer 10. As illustrated in FIG. 1B, the SiC layer 20 extends to an (upper) typically flat first side (surface) 21 of the formed silicon carbide substrate 10, 20. The first side 21 is typically also a C-side of the SiC substrate 10, 20.

If the SiC donor wafer 10 is (substantially) free of BPDs and/or stacking faults, this also applies to the epitaxial layer 20 deposited thereon.

Even if the defect density of BPDs of the SiC donor wafer 10 is higher than the first defect density, for example up to two times, more typically at least three times or even more than ten times or even more than 100 times, the epitaxial layer 20 may be formed with lower defect density of BPDs due to transforming BPDs to less critical threading edge dislocations (TSDs) which are the energetically preferred dislocation species (lower line energy and shorter dislocation length as nearly perpendicular to the epi growth surface). The transfer rate between BPDs and TEDs can be influenced by epi growth parameters like growth speed, C/Si ratio in the gas phase and process gas pressure. The epitaxial layer 20 may be formed with a defect density of BPDs which is lower by at least an improvement factor of about five, more typically of about 10 or even 100 than a defect density of BPDs of the SiC donor wafer 10. Accordingly, the SiC donor wafer 10 may also have a local defect density of BPDs of at most about the first defect density times the improvement factor.

The (layer) thickness of the epitaxial silicon carbide layer 20 may be chosen such that the monocrystalline SiC layer 20 may later be subjected to one or several splitting processes such as smart cut processes as explained below with regard to FIG. 1D to FIG. 2A. Accordingly, process costs may be reduced. Since no hole injection takes place during manufacturing, possibly existing BPDs of an acceptor layer or carrier wafer attached prior to splitting cannot penetrate into the SiC layer 20 or convert into stacking faults. Accordingly, SiC split layers of high quality (low PBD defect density) may be transferred using the splitting process.

Figure 1C:
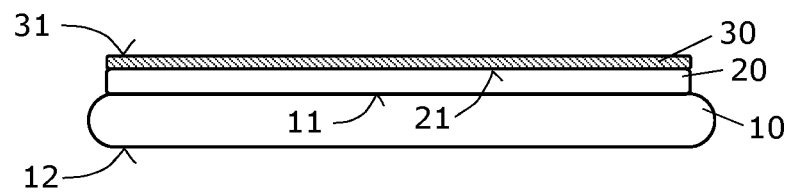

A graphene layer 30 may be formed at the first side 21 (or 11 in embodiments without the SiC layer 20) of a silicon carbide substrate 10, 20 having at least close to the first side, e.g. at the first side to a depth of at least about 1 µm, of at least about 2 µm, of at least about 10 µm, of at least about 50 µm or even of at least about 100 µm, a first median defect density of basal plane dislocations (BPDs) of typically at most about $5*10^2/cm^2$, more typically of at most about $2.5*10^2/cm^2$, and even more typically of at most about $1*10^2/cm^2$. The resulting composite structure is illustrated in FIG. 1C.

The graphene layer 30 is typically formed at the C-side 21 (or 11 in embodiments without the SiC layer 20) of the silicon carbide substrate 10, 20.

However, the graphene layer 30 may also be formed at the Si-side of the silicon carbide substrate 10, 20.

Typically, a single (i.e. one) graphene layer 30 is formed at the first side 21.

Alternatively, additionally or optionally, a multi-layer graphene structure typically including less than 10 atomic layers of graphene (between 1 atomic layer and 10 atomic layers of graphene) may be formed on the first side 21.

Each graphene layer 30 formed may be a single monolayer of carbon, which may include or may be a two-dimensional sheet of sp2-bonded carbon (C) atoms arranged in a honeycomb lattice.

As illustrated in FIG. 1C, the graphene layer(s) 30 is typically formed directly on the first side 21 of the SiC layer 20 (without any layer of another material in between).

The graphene layer(s) 30 may be formed by applying a temper process (e.g. a temperature or heating process) to the silicon carbide substrate 10, 20.

For example, the graphene layer(s) 30 may be formed by heating (e.g. tempering) the SiC substrate 10, 20 to a temperature of at least about 900° C., more typically at least about 950° C. in a vacuum or in an inert atmosphere such as a nitrogen or noble gas atmosphere, e.g. an argon atmosphere. Typically, an oven temperature of between 950° C. and 1800° C. may be chosen. For example, an oven temperature of about 1250° C. to 1600° C. may be selected for an argon atmosphere. Optionally, a second annealing in hydrogen containing atmosphere may follow to fully or partially intercalate the graphene layer formed.

The graphene layer(s) 30 may be formed by a solid state graphitization due to a desorption (or evaporation) of silicon (from the SiC based substrate, in particular the C-side) and the formation of excess carbon on the first side 21 which is typically a C-side of the SiC substrate 10, 20, for example.

Alternatively, the graphene layer(s) 30 may be formed on a Silicon face (Si-face) of the SiC substrate 10, 20.

The graphene layer(s) 30 may also be formed using a laser process at the first side 21, in particular the C-side 21 in an inert atmosphere or in vacuum.

As illustrated in FIG. 1C, the graphene layer(s) 30 may at least substantially cover the first side 21.

However, the graphene layer(s) 30 may also be interrupted. Typically, the fraction of interruptions (openings in the graphene layer(s) 30, coverage of areas without graphene at the first side 21) is less than 10% (or less than 5%) of the total area. These interruptions will result in a direct SiC—SiC bonding which improves the mechanical stability of the later formed wafer-stack.

The interruptions/openings of the graphene layer(s) 30 can be formed, for example, by structuring the graphene layer(s) 30 in predetermined areas, in particular non-device areas of the SiC substrate 10, 20, such as later sawing areas (singulation areas) or at the edge of the SiC substrate 10, 20 and wafer, respectively, and/or unipolar device areas. In the devices to be manufactured (on wafer-level), the non-device areas are no longer present. In the unipolar device areas, no recombination is expected to take place during device operation. Accordingly, any existing crystal defects present in a SiC-material later bonded to the graphene layer(s) 30 cannot be stimulated to grow through the openings of the graphene layer(s) 30 and to convert into stacking faults by electron-hole recombination during device operation.

Structuring the graphene layer(s) 30 may be achieved by masked etching.

Typically, the graphene layer(s) 30 has a plurality of openings.

In the unipolar device area(s), the maximal lateral (horizontal) dimension of the opening(s) may be comparatively small, e.g. in a range between 10 nm and 10 µm.

In the non-device area(s), the maximal lateral dimension of the opening(s) is typically larger, e.g. at least about 20 µm, 50 µm, 100 µm or even 500 µm. The maximal lateral dimension of the opening(s) in the non-device area(s) may be even in the mm-range or cm-range (lateral size of a scribe line).

Further, the opening(s) in the non-device area(s) is typically formed between two device areas of the silicon carbide substrate 10, 20 and/or may at least substantially surround one device area, several or even each device area in a projection onto the first side 21 and when seen from above, respectively.

As explained above, laser irradiation of the first side 21 under inert gas may also be used to form the graphene layer(s) 30. Gaps in the laser irradiation may be used to create the desired openings (interruptions) of the graphene layer(s) 30.

Instead of the graphene layer(s) 30, layer(s) of other highly conductive and temperature-stable materials such as ternary nitrides and ternary carbides or carbon may be used to provide recombination zones in the semiconductor devices to be manufactured.

For example, ternary nitride and/or ternary carbide and/or carbon layer(s) may be formed by a respective CVD process. Their thickness may also be in the range of less than 200 nm, or even less than 50 nm.

For the ternary carbides layer(s) and ternary nitrides layer(s), respectively, three-substance systems having, in addition to the elements carbon and nitrogen, respectively, one element from the group of transition metals Sc, Ti, Cr, V, Zr, Nb, Mo, HF and/or Ta may preferably be used. Further, semiconductor elements from the group Al, Si, P, S, Ga, Ge, As, Cd, In, Sn, Te and/or Pb may be used as the further (third) element in the three-substance systems based on carbon or nitrogen. Highly conductive and high-temperature-resistant materials of the 2-1-1 type are known from these three groups, whose compound molecules comprise two transition metal atoms from the above group, one semiconductor element from the above group and either carbon or nitrogen. So far, forty carbides of the 2-1-1 composition are known and may be used for the layer(s) 30. Furthermore, carbides which are of the 3-1-2 type, such as titanium aluminum carbide ($Ti_3AlC_2$), titanium germanium carbide ($Ti_3GeC_2$) or titanium silicon carbide ($Ti_3SiC_2$) may preferably be used for the layer(s) 30. There is a variety of solid and stable ternary nitride compounds of the 2-1-1 type that may also be used for the layer(s) 30. Further, titanium aluminum nitride ($Ti_4AlN_3$), which is of the 4-1-3 type, may be used for the layer(s) 30.

However, the formation of graphene layer(s) or other carbon layer(s) 30 at the SiC substrate 10, 20 is typically easier (less expensive).

The carbon layer(s) 30 may be formed as amorphous carbon or crystalline carbon in the form of graphite, but may also be made of mixed carbon forms.

Figure 1D:
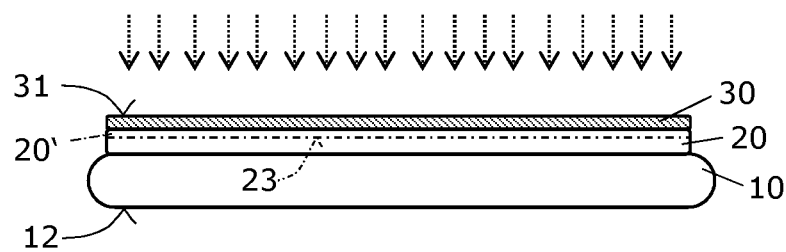

As illustrated in FIG. 1D by the dotted arrows, particles, typically protons may be implanted into the SiC substrate 10, 20 through the first side 21 into a given depth. The implantation depth can be adjusted by selecting the implantation energy.

The implantation of atoms or ions (typically gas ions such as protons), respectively, may cause the formation of a delamination layer (also referred to as separation layer) in a plane 23 which is in the following also referred to as split plane 23. The split plane 23 and the delamination layer, respectively, are typically parallel to the first side 21. The delamination layer can be a micro-bubble layer or microporous layer along the SiC substrate 10, 20.

The implantation depth defines the position of the split plane 23 and the delamination layer, respectively, and thus the thickness of a split layer 20' of the SiC substrate 10, 20 to be transferred to an acceptor wafer in a so called smart cut process. For example, 80 keV protons with a dose between $2*10^{16}$ cm$^{-2}$ and $8*10^{16}$ cm$^{-2}$ are mainly implanted to a depth of about 0.1-3 or to a depth of about 0.2 and 0.5 μm in SiC. Typically, the proton implantation energy is in range from about 50 keV to about 200 keV.

Alternatively, the delamination layer may be formed using (a further) laser irradiation. In particular, a focused laser beam which is focused to the split plane 23 may scan across the SiC substrate 10, 20. Accordingly, a layer of micro-crack spots may be formed in the SiC substrate 10, 20. The later transfer to an acceptor wafer in a so called cold split process may be achieved by at least one of thermally induced mechanical stress, a mechanical stress applied to the SiC substrate from a surface and irradiation induced stress in the split plane 23. The irradiation may be yet a further laser irradiation.

Compared to the smart-cut layer transfer, cold splitting allows transferring significantly thicker split layers 20' of high quality monocrystalline SiC. For example, SiC split layers 20' in a layer thickness range of about 2 μm-100 μm may be transferred. Accordingly, an epitaxial deposition of a thick SiC buffer layer or drain zone or emitter zone often used for mechanical stabilization may be omitted for manufacturing of vertical semiconductor devices with comparatively low nominal blocking capacity and thus lower drift zone thickness (e. g. about 4.5 μm for a 650 V device).

Figure 1E:
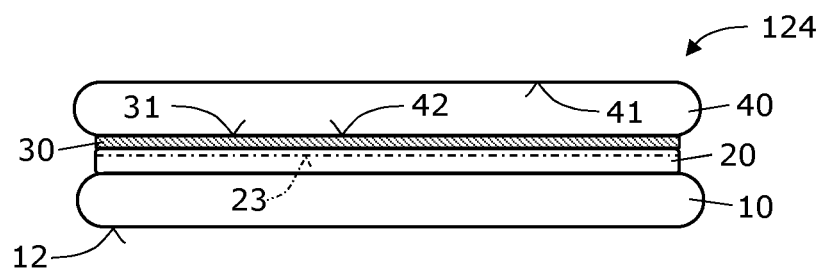

Thereafter, a SiC acceptor layer 40, typically a SiC acceptor wafer, may be attached at the graphene layer(s) 30. The resulting wafer-stack 124 is illustrated in FIG. 1E.

In the following, the SiC substrate 10, 20 is also referred to as first silicon carbide layer, and the SiC acceptor layer 40 is also referred to as second silicon carbide layer 40.

The acceptor layer 40 may be made of silicon carbide having a second defect density higher than the first defect density of the SiC substrate 10, 20 at and/or next to the first side 21 (interface with the graphene layer(s) 30) or even throughout the whole layer 40. The second defect density may be at least about $1.5 \times 10^3$/cm$^2$, at least about $1.7 \times 10^3$/cm$^2$ or even at least about $3 \times 10^3$/cm$^2$. Accordingly, a comparatively cheap SiC acceptor layer 40 and wafer, respectively, for example a non-monocrystalline SiC wafer such as a poly-SiC wafer or a composite wafer, e.g. a non-monocrystalline SIC-layer attached to a carbon-based carrier, may be used.

The second defect density may be at least about two times the first defect density, more typically at least about 10 times or even 100 times the first defect density. The second defect density may even be at least about 1000 times the first defect density.

Attaching of the SiC acceptor layer 40 to the graphene layer(s) 30 is typically done by (wafer) bonding.

The bond connection between the SiC substrate 10, 20 covered by the graphene layer(s) 30 and the SiC acceptor layer 40, i.e. between the graphene layer(s) 30 and the SiC acceptor layer 40 may be implemented such that it can withstand temperatures of at least about 1300° C. or of at least about 1450° C., e.g. temperatures of up to about 1600° C. used for a later smart-cut layer transfer and subsequent epitaxial growth.

The bonding is typically accomplished by anodic bonding.

In another embodiment, the graphene layer(s) 30 are formed at the SiC acceptor layer 40, and, thereafter, the SiC substrate 10, 20 is attached at the graphene layer(s) 30 by (anodic) bonding.

In still another embodiment, graphene layers 30 are formed both at the SiC substrate 10 and at the SiC acceptor layer 40 prior to (anodic) bonding.

However, the graphene layer(s) 30 is preferably formed only at the SiC substrate 10, 20 due to its lower defect density.

In the formed wafer stack 124, the defect density of BPDs may be highest in the SiC acceptor layer 40, lowest in the epitaxial SiC layer 20, and may have an intermediate value in the SiC donor wafer 10.

The vertical extension of the SiC wafer 40 between its first side 41 and second side 42 is typically in a range from about 10 µm to about 2500 µm, more typically in a range from about 50 µm to about 1500 µm.

As the SiC substrate 10, 20 is at least substantially BPD- and stacking fault-free (at most 50 BPD and stacking errors cm$^2$), this typically also applies to SiC layer which are later epitaxially deposited thereon. Accordingly, the injection of holes into the (epitaxially deposited) drift zone should no longer have any harmful effects on the drift zone during device operation, since the underneath graphene layer(s) 30 leads to a very effective recombination of holes injected from above. Therefore, no recombination takes place in parts of the potentially poorer acceptor layer 40 remaining in the final device. Thus, any BPDs and stacking faults of the (remaining) acceptor layer 40 are not stimulated to grow. This prevents the penetration and growth of stacking faults in the drift zone as a whole.

Furthermore, the graphene layer(s) 30 can serve as a bond interface on the one hand, and on the other hand can form a good Ohmic contact both to the silicon carbide split layer 20' layer to be formed as well as to the acceptor layer 40, in particular for respective n-type SIC-layers 20', 40. Thus, the graphene layer(s) 30 do practically not contribute to the series resistance (Ron).

Even further, the graphene layer(s) 30 may, due to its excellent electrical and thermal properties, also serve as a current spread layer and heat spread layer in the device to be manufactured. This may effectively reduce the risk of forming current filaments during device operation.

The processes explained above with regard to FIG. 1A to FIG. 1E may also be described as providing a wafer-stack 124 consisting of or including a monocrystalline first silicon carbide layer 10, 20 having a first defect density of basal plane dislocations, a second silicon carbide layer 40 having a second defect density of basal plane dislocations which is larger than the first defect density, typically at least two times the first defect density, and an intermediate layer 30 which is not based on silicon carbide, sandwiched between the first silicon carbide layer 10, 20 and the second silicon carbide layer 40, and provides recombination centers for holes. The recombination rate in the intermediate layer 30 is typically at least a factor of 10 or even more than a factor of 100 higher than in the drift zone region.

The intermediate layer 30 may be a layer, typically a monolayer of graphene, a ternary nitride, and a ternary carbide.

Figure 2A:
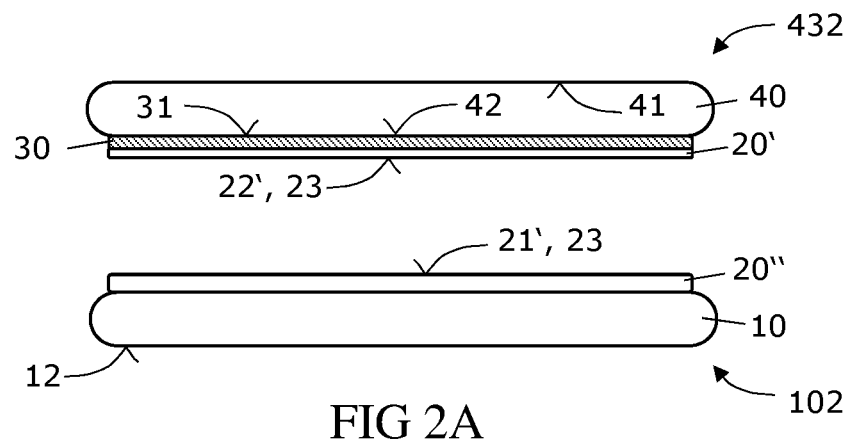

As illustrated in FIG. 2A, the wafer-stack 124 may be split along the split plane 23 (internal delamination layer) to form a device wafer 432 and residual wafer 102.

This may be achieved by tempering at high temperature of at least 800° C. where splitting occurs (smart cutting). This may be a further tempering step, e.g. a de-bond annealing at about 1450° C. for about three hours, or done in parallel with hardening the bond connection between SiC and graphene as explained above with regard to FIG. 1E.

Alternatively, a stress-inducing cooling process may be used for splitting (cold splitting). For example, liquid nitrogen may be sprayed on the first side 41 or alternatively a stress-inducing layer may be temporarily deposited onto at least one of the two wafer sides 12, 41. In another example, an irradiation induced stress in the split plane 23 may be used for splitting. The irradiation may be yet a further laser irradiation.

After polishing, for example by using a CMP-process (chemical mechanical polishing), and cleaning the silicon carbide split layer 20" of the residual wafer 102, the residual wafer 102 may be reused (e.g. more than 5 times or more than 10 times) in a further process cycle, e.g. starting with forming a graphene layer at the first side 21' of the residual wafer 102 as explained above with regard to FIG. 1C. When an additional layer 20 has been deposited on the donor wafer 10, the wafer 10 can be used very often. This may be very cost-efficient After polishing, for example by using a CMP-process, and cleaning the silicon carbide split layer 20' at the first side 22' of the device wafer 432, an epitaxial silicon carbide layer 50 of low defect density (at most or even less than 50 BPDs per cm$^2$) may be formed at the silicon carbide split layer 20'.

Figure 2B:
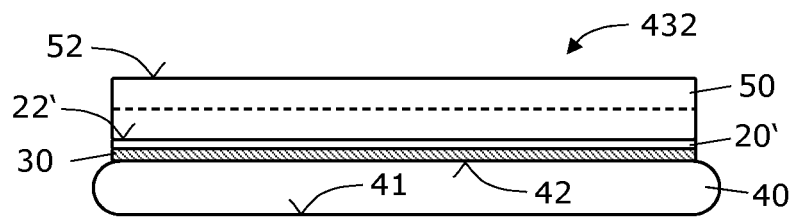

As illustrated by the dashed line in FIG. 2B, one or several processes of epitaxial SiC depositions may be used to form the typically n-doped epitaxial silicon carbide layer 50 of low defect density.

The epitaxial silicon carbide layer 50 may include two or more sublayers of different layer thickness and doping level.

For example, an upper sublayer may form a drift layer extending to an upper side 52 of the SiC layer 50, and arranged on a lower sublayer forming a higher doped buffer layer provided between the graphene layer 30 and the drift (zone) layer.

The vertical thickness of the drift layer is typically in a range between about 0.5 µm and 70 µm, more typically between about 4 µm and 35 µm.

The doping concentration of the drift layer and the upper sub-layer, respectively, is typically at most about $3 \times 10^{16}$/cm$^3$, more typically in range between about $0.5 \times 10^{15}$/cm$^3$ and $10^{16}$/cm$^3$.

The buffer layer may also partly or completely be formed by the split layer 20'.

Prior to epitaxial growth, the split layer 20' may have a thickness of less than 2 µm, or less than 1 µm, or even or even less than 0.5 µm.

The vertical thickness of the buffer layer is typically in a range between about 0.2 µm and 10 µm, more typically between about 0.5 µm and 3 µm.

The doping concentration of the buffer layer and the lower sub-layer, respectively, is typically at least about $10^{16}$/cm$^3$, more typically in range between about $10^{17}$/cm$^3$ and $5*10^{18}$/cm$^3$.

The doping of the epitaxial SiC sub layer(s) 50 may be adjusted during epitaxial growth but may also include dopant implantation(s) and a subsequent annealing.

If the SiC layer 40 is separated from the epitaxial layer(s) 50 after component processing, e. g. for the purpose of reuse, a considerably thicker, highly doped sub layer may be deposited prior to the drift zone epitaxy to ensure the mechanical stability of the residual wafer after separation of the SiC layer 40. In this embodiment, the layer thickness of the highly doped sub layer is typically in the range from about 10 µm to 50 µm.

The buffer layer may also be dimensioned in such a way that the robustness of the device to be manufactured against cosmic radiation, the short-circuit strength and/or the avalanche strength is improved. More particular, the doping level and in particular a doping gradients towards the drift layer may be adjusted in such a way that the maximum field strength occurring dynamically is reduced by at least partially compensating for the electron current flowing in these operating states.

Due to the measures described above, the effective high-doped buffer thickness in the finished component can be kept relatively small. Accordingly, Ron can be kept very low.

Thereafter, the device wafer 124 may be further processed from and/or at the upper side 52 of the device wafer 124 which is provided by the epitaxial silicon carbide layer(s) 50.

Further processing typically includes one, more typically several device manufacturing processes. Typically, bipolar device structures are formed. Further, field effect transistor structures may be formed.

Figure 2C:
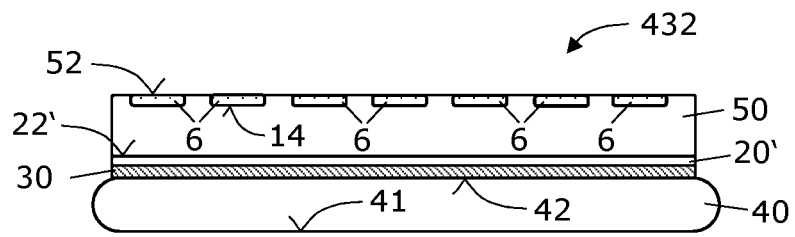

As illustrated in FIG. 2C, this may include forming a plurality of doping regions 6 each forming a rectifying pn-junction 14 in (with) the epitaxial silicon carbide layer 50.

The doping regions 6 are typically formed in device areas separated from each other by singulation areas.

The device regions of the device wafer 124 may be arranged in a checkerboard pattern when seen from above.

Further, several doping regions 6 and/or doping regions of opposite doping type may be formed in each device area.

Depending on the devices to be manufactured, the doping regions 6 may e.g. form body regions (of MOSFET- or IGBT-semiconductor device structures) or anode regions of diode or an integrated freewheeling diode. For simplicity, junction terminations are not shown in the presented figures.

Device manufacturing from the upper side 52 may include processes like implanting p-type dopants such as boron and/or n-type dopants (e.g. phosphorous and/or nitrogen), annealing, etching trenches (also referred to as first trenches) from the upper side 52 into the device wafer 432, insulating sidewalls of the trenches, etching wide trenches (also referred to as second trenches) into the device wafer 432, forming insulated gate electrodes in the trenches, and/or forming insulated gate electrodes on and/or at the upper side 52.

While the trenches are typically formed in the device areas, the wide trenches are typically formed outside the device areas, i.e. in the singulation areas. For example, the layout of the wide trench may, when seen from above, correspond to a lattice. Accordingly, later singulating is facilitated.

Depending on the devices to be manufactured, one or more front-side metallization 8 may be formed on the upper side 52. For example, an emitter or source metallization and a separated gate metallization may be formed on the upper side 52.

Figure 2D:
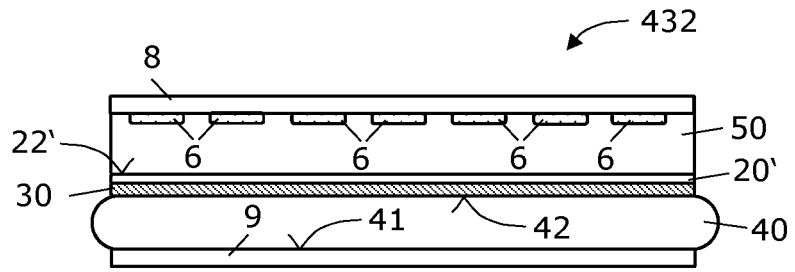

In the exemplary embodiment illustrated in FIG. 2D only one front-side metallization 8 that may e.g. form an anode metallization for bipolar diodes to be manufactured is shown.

Forming the front-side metallization(s) may include depositing one or more metals, e.g. Al, Ti, TiW, TiN, Ta, TaN, Cu, or metal-like materials and an optional subsequent masked etching.

Further, a dielectric layer (not shown in FIG. 2D) may be formed at the upper side 52, for example a silicon oxide layer, and structured.

Furthermore, passivation layers (not shown in FIG. 2D) may be formed on the upper side 52 and or over the front-side metallization(s) 8. For example, an imide layer (not shown in FIG. 2D) overlapping with the front-side metallization(s) may be arranged on the front-side metallization(s).

Typically, at least one of the front-side metallizations is in electric contact with, e.g. Ohmic contact with the epitaxial SiC-layer 50 and/or the doping regions 6.

Alternatively or in addition, at least one of the front-side metallizations forms rectifying Schottky-contacts with the epitaxial SiC-layer 50.

After (device) processing the device wafer 124 from and/or at the upper side 52, the device wafer 124 may be further processed from and/or at its lower side 41 (provided by the first side of the SiC acceptor layer and wafer 40, respectively).

As illustrated in FIG. 2D, a back-side metallization 9 may be formed opposite the front-side metallization(s), for example at and in Ohmic connection with the SiC acceptor layer 40.

Depending on the devices to be manufactured, the back-side metallization 9 may form a cathode metallization, a drain metallization or a collector metallization.

Prior to forming the back-side metallization 9, the device wafer 432 may be suitably thinned at the side 41. The thinning process can include, without being limited thereto, grinding, etching and polishing of the side 41.

Figure 3A:
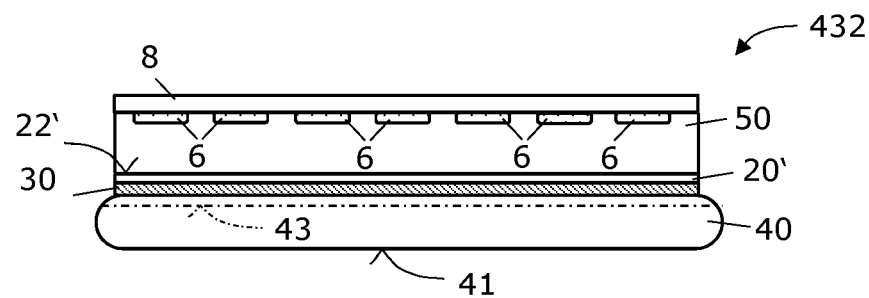

Alternatively or in addition, the device wafer 432 may be split along a split plane 43 in the acceptor layer 40 as illustrated in FIG. 3A.

After polishing, for example by using a CMP-process, a lower split layer of the acceptor layer 40 may be reused as (e.g. more than 5 times or more than 10 times) in a further process cycle. This may reduce costs.

After forming the back-side metallization 9, the device wafer 124 is typically singulated into individual semiconductor devices. This may e.g. be done by sawing or cutting.

Figure 3B:
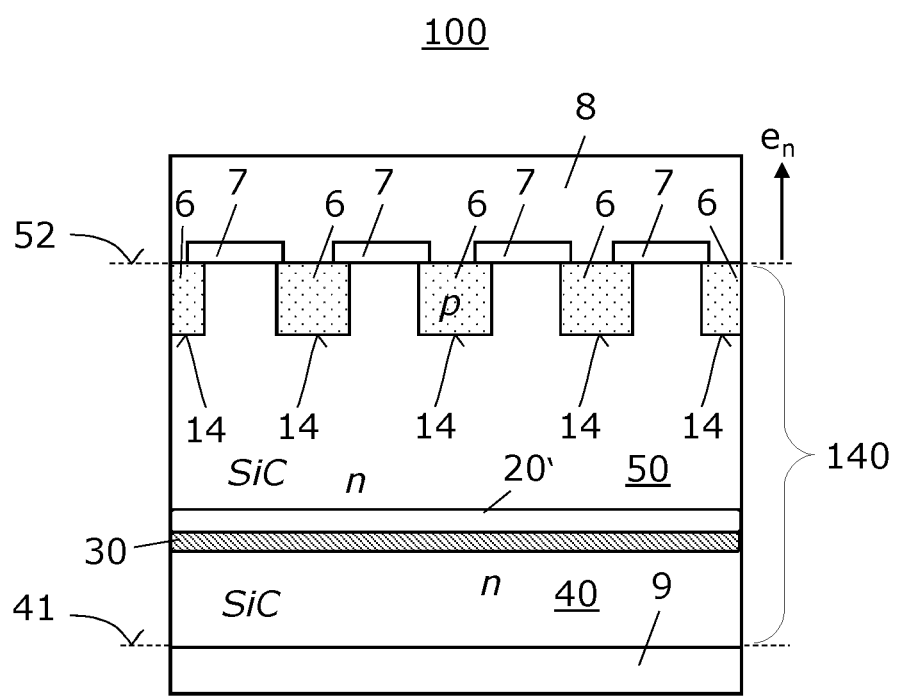
FIG. 3B illustrates a vertical cross-section through a semiconductor device according to an embodiment.

FIG. 3B illustrates an exemplary vertical two-terminal power semiconductor device 100 that may be manufactured with the methods explained above with regard to FIG. 1A to FIG. 3A.

The semiconductor device 100 may be a bipolar power diode. However, this is to be understood as a non-limiting example. Other examples include three-terminal devices such as FETs or IGBTs.

Semiconductor device 100 includes a composite semiconductor body 140 formed by a monocrystalline n-type first silicon carbide layer 20', 50 having a first density of basal plane dislocations, a conductive intermediate layer 30 arranged at the monocrystalline first silicon carbide layer 20', 50 made of graphene, a ternary nitride, or a ternary carbide, and a n-type second silicon carbide layer 40 arranged at the conductive intermediate layer 30 and having a second density of basal plane dislocations which is larger, typically at least two times the first density of basal plane dislocations.

The conductive intermediate layer 30 may be a graphene layer and/or a monolayer.

Typically, the conductive intermediate layer 30 is a graphene layer, more typically a graphene mono layer.

The second silicon carbide layer 40 may be made of amorphous SiC or poly-SiC.

In the exemplary embodiment, a plurality of p-type anode regions 6 is arranged in the first silicon carbide layer 20', 50. The anode regions 6 form respective pn-junctions 14 with an upper sub-layer 50 of the first silicon carbide layer 20', 50.

The upper sub-layer 50 may have a lower doping concentration of e.g. at most about $10^{16}/cm^3$ than a lower sub-layer 20' of the first silicon carbide layer 20', 50 that may have a doping concentration of at least about $10^{17}/cm^3$.

A front-side metallization 8 typically forming an anode metallization is arranged on the first silicon carbide layer 20',

50, in Ohmic contact with the anode regions 6 and separated from the first silicon carbide layer 20', 50 by dielectric regions 7 arranged at the upper side of the composite semiconductor body 140.

A back-side metallization 9 typically forming a cathode metallization is arranged on and in Ohmic contact with the second silicon carbide layer 40.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, the method comprising:
    forming a graphene layer at a first side of a silicon carbide substrate having at least next to the first side a first defect density of at most $5*10^2/cm^2$;
    attaching an acceptor layer at the graphene layer to form a wafer-stack, the acceptor layer comprising silicon carbide having a second defect density higher than the first defect density;
    splitting the wafer-stack along a split plane in the silicon carbide substrate to form a device wafer comprising the graphene layer and a silicon carbide split layer at the graphene layer;
    forming on the silicon carbide split layer an epitaxial silicon carbide layer extending to an upper side of the device wafer; and
    further processing the device wafer at the upper side.

2. The method of claim 1, further comprising forming an opening in the graphene layer prior to attaching the acceptor layer.

3. The method of claim 2, wherein the opening is formed in an edge area of the silicon carbide substrate and between two device areas of the silicon carbide substrate, and/or wherein the opening substantially laterally surrounds the device areas, and/or wherein a plurality of openings is formed in the graphene layer, and/or wherein a maximal lateral dimension of the opening and/or each opening of the plurality of openings lies between 10 nm and 10 µm or is at least 50 µm.

4. The method of claim 1, wherein forming the graphene layer comprises heating the silicon carbide substrate to a temperature of at least about 950° C. and/or at most about 1800° C. in a vacuum or in an inert atmosphere.

5. The method of claim 1, wherein forming the graphene layer comprises irradiating the upper side in a vacuum or in an inert atmosphere with a laser.

6. The method of claim 1, wherein the graphene layer is formed on a carbon face of the silicon carbide substrate, and/or wherein the graphene layer is formed as a monolayer.

7. The method of claim 1, wherein the further processing comprises:
    forming a semiconductor device structure comprising at least one doping region in the epitaxial silicon carbide layer; and/or
    implanting dopants from the upper side into the epitaxial silicon carbide layer; and/or
    implanting nitrogen into the epitaxial silicon carbide layer; and/or
    forming a field effect transistor structure next to the upper side; and/or
    etching trenches from the upper side into the epitaxial silicon carbide layer; and/or
    insulating sidewalls of the trenches; and/or
    forming a rectifying junction in and/or at the epitaxial silicon carbide layer; and/or
    forming a front-side metallization on the upper side.

8. The method of claim 1, wherein the second defect density is at least about two times the first defect density, and/or wherein the second defect density is at least about $1.5*10^3/cm^2$, and/or wherein the first defect density and the second defect density refer to and/or include respective densities of basal plane dislocations, and/or wherein the acceptor layer comprises non-monocrystalline silicon carbide, and/or wherein the acceptor layer is formed at a carbon-based carrier, and/or wherein the acceptor layer is provided by a composite wafer.

9. A method for forming a semiconductor device, the method comprising:
    providing a wafer-stack comprising a monocrystalline first silicon carbide layer comprising a first defect density of basal plane dislocations, a second silicon carbide layer comprising a second defect density of basal plane dislocations which is at least two times the first defect density, and an intermediate layer which is not based on silicon carbide, sandwiched between the first silicon carbide layer and the second silicon carbide layer and comprising recombination centers for holes;
    splitting the wafer-stack along a split plane in the first silicon carbide layer to form a device wafer comprising the intermediate layer and a silicon carbide split layer covering the intermediate layer;
    epitaxial depositing silicon carbide to form an epitaxial silicon carbide layer at the silicon carbide split layer; and
    forming a rectifying junction in and/or at the epitaxial silicon carbide layer.

10. The method of claim 9, wherein the intermediate layer comprises at least one layer comprising a material selected from the group consisting of graphene, a ternary nitride, and a ternary carbide, and/or at least one carbon layer.

11. The method of claim 9, wherein providing the wafer-stack comprises:

forming a graphene layer at a first side of a silicon carbide substrate having at least next to the first side a first defect density of at most $5*10^2/cm^2$;

wafer-bonding an acceptor layer at the graphene layer to form the wafer-stack, the acceptor layer comprising silicon carbide having a second defect density of at least about $1.5*10^3/cm^2$, or forming a graphene layer at an acceptor layer comprising silicon carbide having a second defect density of at least about $1.5*10^3/cm^2$; and wafer-bonding a silicon carbide substrate having a first defect density of at most $5*10^2/cm^2$ at the graphene layer to form the wafer-stack.

12. The method of claim 9, wherein prior to forming the graphene layer the method further comprises:

providing a monocrystalline silicon carbide donor substrate; and/or forming a monocrystalline epitaxial silicon carbide layer at the monocrystalline silicon carbide donor substrate so that a defect density of the epitaxial silicon carbide layer is lower than a defect density of the monocrystalline silicon carbide donor substrate by at least an improvement factor of about five; and/or forming a monocrystalline epitaxial silicon carbide layer at the monocrystalline silicon carbide donor substrate so that a defect density of the epitaxial silicon carbide layer is at most about the first defect density; and/or wherein a defect density of basal plane dislocations in the wafer-stack has a lowest value in the monocrystalline epitaxial silicon carbide layer, has an intermediate value in the monocrystalline silicon carbide donor substrate and has a highest value in the acceptor layer or the second silicon carbide layer.

13. The method of claim 9, wherein splitting the wafer-stack comprises:

using a stress-inducing heating or cooling process for inducing stress in the silicon carbide substrate or in the first silicon carbide layer; and/or depositing a stress-inducing layer on at least one side of the wafer stack; and/or implanting protons into the silicon carbide substrate or into the first silicon carbide layer; and/or using a focused laser beam to irradiate the silicon carbide substrate or the first silicon carbide layer; and/or polishing the silicon carbide split layer; and/or cleaning the silicon carbide split layer.

14. The method of claim 9, further comprising:

splitting the device wafer along a split plane in the acceptor layer; and/or reusing a split layer of the acceptor layer; and/or thinning the acceptor layer; and/or reusing a residual wafer formed by splitting the wafer-stack; and/or forming a back-side metallization opposite the front-side metallization and/or in Ohmic connection with at least a portion the second silicon carbide layer; and/or singulating the device wafer into individual semiconductor devices.

15. A semiconductor device, comprising:

a monocrystalline first silicon carbide layer comprising a first density of basal plane dislocations;

a conductive intermediate layer arranged at the monocrystalline first silicon carbide layer and comprising graphene, a ternary nitride, a ternary carbide, and/or a carbon layer;

a second silicon carbide layer arranged at the conductive intermediate layer and comprising a second density of basal plane dislocations which is at least two times the first density of basal plane dislocations;

a first metallization arranged on the first silicon carbide layer; and a second metallization arranged on the second silicon carbide layer, wherein the conductive intermediate layer is a graphene layer.

16. The semiconductor device of claim 15, wherein the semiconductor device is a power semiconductor device, and/or wherein the semiconductor device comprises at least one of or is implemented as one of: a bipolar diode, an IGBT, and a FET comprising a bipolar free-wheeling diode.

17. The semiconductor device of claim 15, wherein the second silicon carbide layer comprises poly-SiC, and/or wherein the second silicon carbide layer comprises a doping concentration of at least about $10^{18}/cm^3$.

18. The semiconductor device of claim 15, wherein the second density is at least about $1.5*10^3/cm^2$, and/or wherein the first density is at most about $5*10^2/cm^2$.

19. The semiconductor device of claim 15, wherein the first silicon carbide layer is of the n-type, and/or wherein the first silicon carbide layer comprises an upper sub-layer comprising a doping concentration of at most about $3*10^{16}/cm^3$, and/or wherein the first silicon carbide layer comprises a lower sub-layer comprising a doping concentration of at least about $10^{17}/cm^3$.

20. A semiconductor device, comprising:

a monocrystalline first silicon carbide layer comprising a first density of basal plane dislocations;

a conductive intermediate layer arranged at the monocrystalline first silicon carbide layer and comprising graphene, a ternary nitride, a ternary carbide, and/or a carbon layer;

a second silicon carbide layer arranged at the conductive intermediate layer and comprising a second density of basal plane dislocations which is at least two times the first density of basal plane dislocations;

a first metallization arranged on the first silicon carbide layer; and a second metallization arranged on the second silicon carbide layer, wherein the second density is at least about $1.5*10^3/cm^2$, and/or wherein the first density is at most about $5*10^2/cm^2$.

* * * * *